United States Patent [19]

Gottsmann et al.

[11] 3,849,790

[45] Nov. 19, 1974

[54] LASER AND METHOD OF MAKING SAME

[75] Inventors: Hartmut Gottsmann, Unterkirchberg; Joachim Specovius, Brackwede, both of Germany

[73] Assignee: Licentia Patent-Verwaltungs GmbH, Frankfurt am Main, Germany

[22] Filed: July 26, 1972

[21] Appl. No.: 275,191

[30] Foreign Application Priority Data

July 29, 1971 Germany............................ 2137892

[52] U.S. Cl.................. 357/18, 331/94.5 H, 357/16, 357/56

[51] Int. Cl............................. H01s 3/06, H01s 3/18

[58] Field of Search................. 317/235 AC, 235 N; 331/94.5 H

[56] References Cited

UNITED STATES PATENTS

| | | | |
|---|---|---|---|
| 3,303,432 | 2/1967 | Garfinkel et al. | 331/94.5 |
| 3,341,937 | 9/1967 | Dill | 331/94.5 |
| 3,445,303 | 5/1969 | Engbert | 148/187 |
| 3,479,613 | 11/1969 | Ruprecht et al. | 331/94.5 |
| 3,495,140 | 2/1970 | Cornely et al. | 331/94.5 |
| 3,579,055 | 5/1971 | Ross | 331/94.5 |
| 3,691,476 | 9/1972 | Hayashi | 317/235 N |
| 3,697,336 | 10/1972 | Lamorte | 317/235 N |

OTHER PUBLICATIONS

Kosonocky, "Very Low Power Semiconductor Laser," RCA Technical Note, No. 781, Sept. 25, 1968.

IEEE Standard Dictionary of Electrical and Electronics terms, (Wiley–Interscience, New York, Publishers), 1972, pages 286–287.

*Primary Examiner*—Rudolph V. Rolinec
*Assistant Examiner*—William D. Larkins
*Attorney, Agent, or Firm*—Spencer & Kaye

[57] ABSTRACT

A semiconductor laser and methods of making same. The semiconductor laser is in the form of a diode, preferably a heterostructural diode. The diode includes a light-emitting active region. A layer of one conductivity type is disposed at a small distance from said light-emitting active region. Means are provided adjacent the layer of one conductivity type to block current flow through laterally extending portions of the layer for confining the curent to a narrow path through the layer. The method of making the semiconductor laser includes applying a mask to the surface of the semiconductor layer of the one conductivity type, the mask corresponding to the lateral outline of the current-conducting path to be formed. Thereafter, either the exposed portions of the surface are removed by etching or doping material is diffused into the layer of one conductive type through the exposed portions of the surface to produce regions therein of opposite conductivity type.

16 Claims, 16 Drawing Figures

LASER AND METHOD OF MAKING SAME

BACKGROUND OF THE INVENTION

This invention relates to a semiconductor laser having a layer sequence in the form of a semiconductor diode, preferably a heterostructure diode and to a method of making such a semiconductor diode.

Semiconductor lasers are already known in the art. When light energy is coupled from such a semiconductor laser into a light-conductive fiber, losses generally occur which are mainly a result of a mode mismatch between the laser and the fiber. In a light-conductive fiber whose core diameter is of the order of magnitude of the wavelength of the emitted radiation, generally only a basic mode can be propagated, although the known semiconductor lasers emit a large number of modes.

Semiconductor lasers, which may be constructed as diffused diodes, epitaxial diodes or heterostructure diodes, are able to convert electrical energy into radiation energy in an active zone which is disposed between oppositely doped semiconductive layers, for example, of n-type and p-type conductive material. The laser radiation, which begins at a certain threshold current density, in these known lasers emerges from the laser resonator out of a narrow region lying between these opposite conductivity type semiconductive crystalline layers, the narrow region being limited by the cleavage planes at the ends of the crystals. Due to the extremely small expanse of the active zone in a direction perpendicular to the plane of the semiconductor wafer and to the relatively large expanse of the active zone in a direction parallel to this plane, the exit surface for the laser radiation is substantially larger than the coupling area of, for example, a light-conductive fiber, so that high light energies and consequently high current density are required to compensate for the resulting losses. In addition, the necessity arises at such current densities of providing special measures for the dissipation of the resulting heat.

Improvements in this direction have been obtained by heterostructures which are well suited for charge carrier limitation and for the guidance of the laser radiation in a direction perpendicular to the plane of the active zone. The active zone can only emit coherently, however, over its entire width when the semiconductor material of this zone is homogeneous. Inhomogeneities in the semiconductor material result in the undesired appearance of individual, separate radiating areas, denominated filaments, so that generally the radiation produced consists of different modes.

An arrangement is also known in which one of the electrodes of the diode is constructed in the form of a strip-shaped electrode so that it is possible for the exciting current to penetrate the diode in a manner which is not uniform over its entire cross section but rather the current density in the vicinity of the strip-shaped electrode is higher than at other regions. Thus, the total threshold current can be kept lower, but high localized threshold current densities result. Relatively high radiation losses occur moreover due to the poor lateral wave guidance and the lateral absorption of the laser radiation in the plane of the active zone.

SUMMARY OF THE INVENTION

An object of the present invention is to provide a semi-conductor laser having a layer sequence in the form of a semi-conductor diode and which presents a small decoupling surface and a low threshold current density.

A further object of the present invention is to provide a method of making such a semiconductor laser.

The laser according to the invention is a semiconductor laser in the form of a diode and includes a light-emitting active region and a layer of one conductivity type disposed at a small distance from the light-emitting active region. Means adjacent the layer of one conductivity type are provided to block current flow through laterally extending portions of the layer for confining the current to a narrow path through the layer.

Such a laser is fabricated according to the invention by applying a mask to the surface of a semiconductor layer of one conductivity type, the shape of the mask corresponding to the outline of the current-conducting path to be formed, and either removing the exposed portions of the surface by etching or diffusing doping material into the layer through the exposed portions of the surface to produce therein regions of opposite conductivity type.

In a laser constructed in accordance with the present invention, one of the layers disposed at a short distance from the light-emitting active zone is provided with insulating regions and/or oppositely doped regions which are separated from one another by barrier layers, the regions being so constructed that a current flowing in the forward direction of the diode is confined to narrow current paths disposed between the insulating regions or the barrier layers. The advantages of the solution provided by the present invention are that the high current densities produced in the current paths permit the excitation of laser radiation even with low starting currents for the diode and that the area to be excited to radiate can be kept extremely narrow.

DESCRIPTION OF THE PREFERRED EMBODIMENTS

Figure 1:
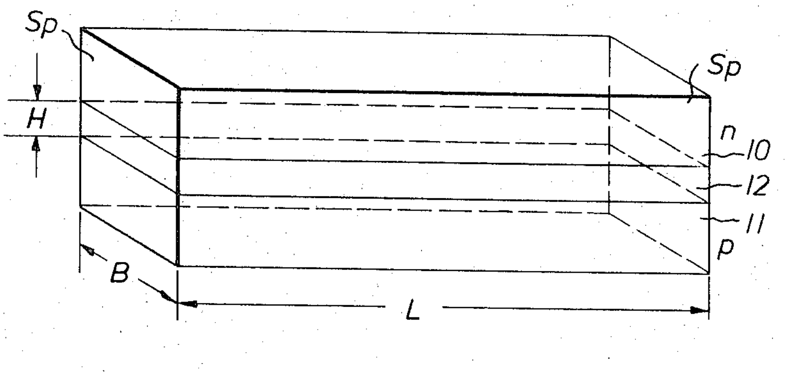
FIG. 1 is a perspective diagrammatic view of a known semiconductor laser in the form of a semiconductor diode.

FIG. 1 is a perspective view of a generalized known semi-conductor laser wafer of a width B and which includes an n-conductive layer 10, a p-conductive layer 11 and an active zone 12 having a height H disposed between the two layers 10, 11. The active zone 12 is usually constructed of compensatedly doped semiconductor material but may, in some cases, be a simple pn-junction. On the upper side of the n-conductive layer 10 and the underside of the p-conductive layer 11 conventional electrodes (not shown) are applied, the electrodes being omitted for the sake of clarity. Two cleavage faces Sp act as semitransparent mirrors which define a closed resonator having a length L. Thus the area formed by the entire width B and the height H of the active zone 12 is available for irradiating the light energy produced in the active zone 12 by radiation resulting from recombination.

Figure 2:
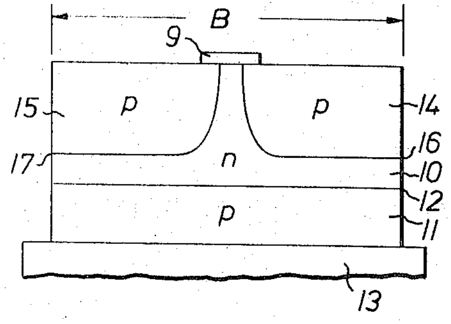
FIG. 2 is a front diagrammatic view of a first embodiment of a semiconductor laser in the form of a diode according to the present invention.

One possibility for reducing the effective exit surface for light from the active zone is to provide an active zone which does not extend over the entire width B, as illustrated in FIG. 2. In FIG. 2, a wafer semiconductor laser, according to a first embodiment of the present invention, includes a p-conductive layer 11 arranged on a heat-dissipating metal support or electrically conductive substrate 13, an n-conductive layer 10 and an active zone or pn-junctions 12 between the layers 10 and 11. Portions of the exposed upper surface of the n-conductive layer 10 are provided with p-conductive layers 14 and 15 so that only a very narrow portion 18 of the n-conductive layer 10 extends to the upper surface of the semiconductor wafer, respective pn-junctions 16 and 17 existing between the respective p-conductive layers 14 and 15 and the n-conductive layer 10. The very narrow portion 18 of the n-conductive layer 10 thus is provided for carrying the current, to the exclusion of the p-conductive layers 14 and 15 because the pn-junctions 16 and 17 will block current flow. The upper surface of the wafer is provided with an electrode 9, the metal support or electrically conductive substrate 13 serving as the other electrode. The electrode 9 need extend only over the narrow portion 18 of the n-conductive layer 10, but may extend over all or parts of the p-conductive layers 14 and 15.

The layer arrangement shown in FIG. 2 can be produced in a simple manner. It is assumed that the semiconductor wafer consists initially of the upper n-conductive layer 10 and the lower p-conductive layer 11 therebelow. A mask, preferably of $SiO_2$, is first applied to the upper surface of the n-conductive layer 10, which mask substantially corresponds to the lateral outline of the area of the n-conductive layer 10 through which the current is to pass. Suitable doping substances which produce a p-type conductivity in the portions of the n-conductive layer 10 below the surface are diffused through the exposed portions of the surface so as to form the p-conductive layers 14, 15 which are each separated from the n-conductive layer 10 by respective pn-junctions 16, 17. Since a slight diffusion also takes place in the lateral direction under the covered portions, a current-carrying channel with smaller lateral dimensions than the mask can be produced.

The newly produced pn-junctions 16 and 17 are blocked in the forward direction of the diode so that the current will pass only through the narrow channel provided by the very narrow portion 18 of the n-conductive layer 10. The thus produced high current density effects an emission of laser radiation even when the starting current of the laser diode is low, i.e., at least one radiating area is excited. Advantageously such a laser diode is additionally affixed to a metallic support or substrate 13 so that sufficient heat dissipation is assured.

A length L of some $100 \times 10^{-6}$m and a width B of about $100 \times 10^{-6}$m are typical dimensions of the layer arrangements shown in FIGS. 1 to 16. The height of the layer arrangement may vary from $30 \times 10^{-6}$m to $100 \times 10^{-6}$m. Typical dimensions of the individual layers are given refering to FIG. 2. To assure a good heat flow to the metallic support or substrate 13 the p-conductive layer 11 has to be as thin as possible. A thickness of less than $3 \times 10^{-6}$m is sufficient. The thickness of the n-conductive layer 10 should not exceed $1 \times 10^{-6}$m. The thickness of the p-conductive layers 14 and 15 may vary from about $30 \times 10^{-6}$m to about $90 \times 10^{-6}$m depending from the height of the complete layer arrangement.

Semiconductive materials used for these semiconductor lasers must have direct transitions from the conduction band to the valence band, for example GaAs. Doping levels may vary from $1 \times 10^{19}$cm$^{-3}$ to $5 \times 10^{19}$cm$^{-3}$ for the p-conductive layer 11 and $1 \times 10^{18}$cm$^{-3}$ to $5 \times 10^{18}$cm$^{-3}$ for the n-conductive layer 10. The doping level of the p-conductive layers 14 and 15 has to be greater than the doping level of the n-conductive layer 10.

The diffusion time is dependent from the semiconductive material used and the desired width of the p-conductive layers 14 and 15. If the semiconductive material is GaAs a diffusion time of approximately 4 hours is necessary to reach a thickness of $40 \times 10^{-6}$m of the p-conductive layers 14 and 15. Substrate and impurity source are at the same temperature of about 850°C.

Figure 3:
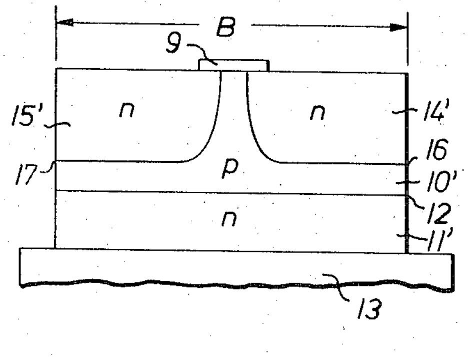
FIGS. 3, 4 and 5 are respective front diagrammatic views, similar to that of FIG. 2, of second, third and fourth embodiments of semiconductor lasers in the form of diodes according to the present invention.

FIG. 3 shows a semiconductor laser which differs from the laser illustrated in FIG. 2 only in that the conductivities of the semiconductive layers 10, 11, 14 and 15 are reversed; these layers are designated 10', 11', 14' and 15' in FIG. 3, the narrow current-carrying portion of the layer 10' being shown as 18'.

Figure 4:
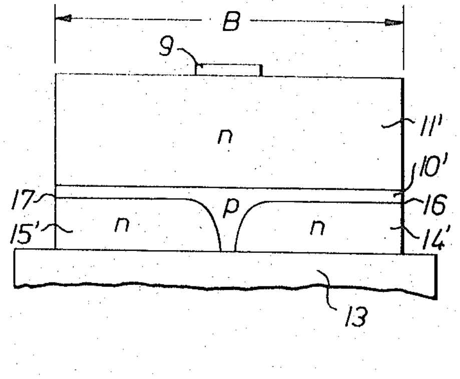

FIG. 4 illustrates a semiconductor laser similar to the laser of FIG. 3. The only essential differences are that the n-conductive layer 11' contacts the electrode 9 while the n-conductive layers 14', 15' and the narrow portion 18' of the p-conductive layer 10' contact the metallic support or substrate 13.

Figure 5:
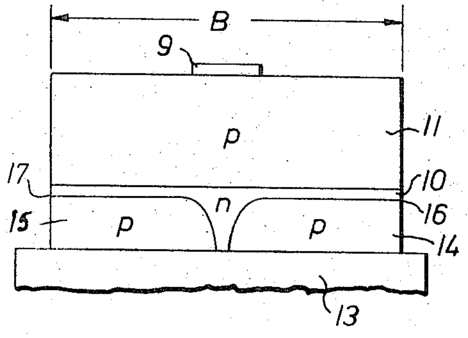

FIG. 5 illustrates a semiconductor laser similar to the laser shown in FIG. 2. Here again, the essential differences are that the p-conductive layers 14, 15 and the narrow portion 18 of the n-conductive layer 10 contact the metallic support or substrate 13, while the p-conductive layer 11 contacts the electrode 9.

It is to be understood that the embodiments shown in FIGS. 3–5 can be produced in an analogous manner to the embodiment of FIG. 2 as described in detail above.

The embodiments which are to be described in detail below relate to heterostructure diodes which consist of an active zone of compensatedly doped semiconductor material. As shown for example in FIGS. 6–9, the heterostructure diodes include n, $n^+$, $p^+$ and p conductivity layers in addition to an active zone.

Figure 6:
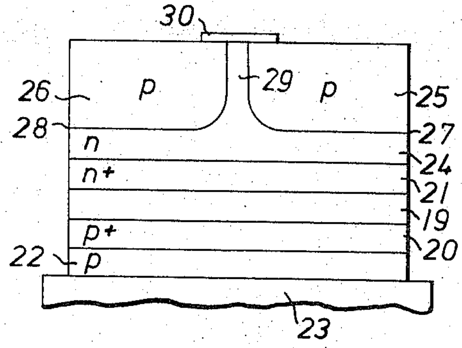
FIG. 6 is a front diagrammatic view of a preferred embodiment of a semiconductor laser in the form of a heterostructure diode according to the present invention.

As shown in FIG. 6, a semiconductor laser in the form of a heterostructure diode according to a preferred embodiment of the present invention includes an active zone 19 of preferentially compensatedly doped semiconductor material. That means that this layer 19 is highly doped as well with donors as with acceptors. A $p^+$-conductive layer 20 and an $n^+$-conductive layer 21 are positioned on opposite lateral surfaces of the active zone 19. A p-conductive layer 22 is positioned between the $p^+$-conductive layer 20 and a metal support or electrically conductive substrate 23. An n-conductive layer 24 is provided on the laterally extending surface of the $n^+$-conductive layer 21. Portions of the exposed upper surface of the n-conductive layer 24 are provided respectively with p-conductive layers 25 and 26, respective pn-junctions 27, 28 existing between each of the p-conductive layers 25, 26 and the n-conductive layer 24. The very narrow portion 29 of the n-conductive layer 24 thus is provided for carrying current, to the exclusion of the p-conductive layers 25 and 26 because the pn-junctions 27 and 28 will block current flow. The upper surface of the wafer is provided with an electrode 30, the metal support or electrically conductive substrate 23 serving as the other electrode. While the electrode 30 is shown as extending over less than the entire lateral upper surface of the wafer, it is to be understood that it need only extend over the narrow portion 29 of the n-conductive layer 24, but may extend over parts or all of the p-conductive layers 26 and 25.

The individual layers can be made, for example, out of the following semiconductor material.

Layer 22 is a $1 \times 10^{-6}$m to $3 \times 10^{-6}$m layer of GaAs with a doping level from $10^{18}$ to $10^{19}$cm$^{-3}$ layer 20 consist of GaAlAs with a thickness of $0.5 \times 10^{-6}$ to $3 \times 10^{-6}$m and the same doping level as layer 22. The active region 19 is again a GaAs layer with a doping level of $10^{18}$cm$^{-3}$ of preferentially compensatedly doped semiconductive material. Its thickness may very from $0.3 \times 10^{-6}$m to $2 \times 10^{-6}$m. 21 is a $3 \times 10^{-6}$m to $10 \times 10^{-6}$m layer of GaAlAs with a doping level of approximately $1 \times 10^{18}$cm$^{-3}$ to $4 \times 10^{18}$cm$^{-3}$.

Layer 24 consists of GaAs with a doping level of $1 \times 10^{18}$cm$^{-3}$ to $5 \times 10^{18}$cm$^{-3}$.

The physical dimensions of the p-conductive layers 25 and 26 and the necessary diffusion steps for generating these layers are the same as explained with FIG. 2.

Figure 7:
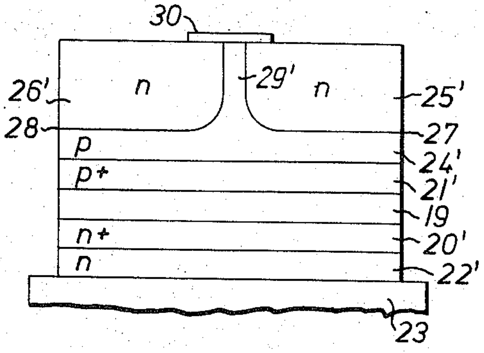
FIGS. 7–11 are respective front diagrammatic views, similar to that of FIG. 6, of preferred further embodiments of semiconductor lasers in the form of respective heterostructure diodes according to the present invention.

FIG. 7 illustrates a semiconductor laser which differs from the laser shown in FIG. 6 essentially only in that the conductivities of the semiconductor layers 20–22 and 24–26 are reversed, the corresponding layers in FIG. 7 being designated 20'–22' and 24'–26'. The corresponding narrow current-carrying portions of the p-conductive layer 24' in FIG. 7 is designated 29'.

Figure 8:
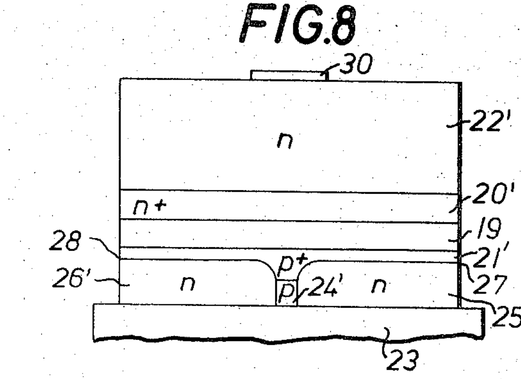
Figure 9:
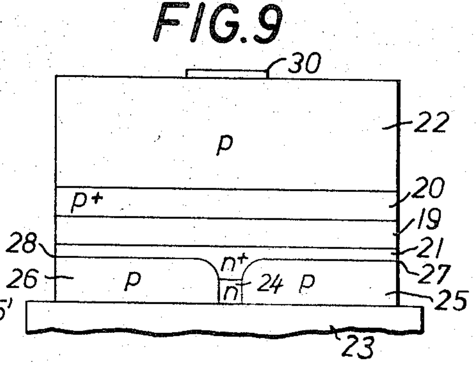

FIGS. 8 and 9 illustrate respectively semiconductor lasers corresponding substantially with the lasers shown in FIGS. 7 and 6. In each of these cases, the positions of the electrode 30 and the metal support or substrate 23 are reversed. In the embodiments shown in FIGS. 8 and 9, the p-conductive layers 25 and 26 (FIG. 9) and the n-conductive layers 25' and 26' (FIG. 8) extend respectively completely through the respective n-conductive layer 24 (FIG. 9) and the p-conductive layer 24' (FIG. 8). This need not be the case; the semiconductive layers shown in FIGS. 8 and 9 can have respectively the exact relationships shown in FIGS. 7 and 6. The semiconductive layer arrangement shown respectively in FIGS. 8 and 9 can be used in conjunction with the electrode arrangements shown respectively in FIGS. 7 and 6.

In the embodiments of FIGS. 6 and 7, the spacing between the valence band and the conductive band is greater in the $n^+$ and $p^+$ layers than in the active zone 19. The p-conductive layers 25 and 26 in the n-conductive layer 24 (FIG. 6) as well as the n-conductive layers 25' and 26' in the p-conductive layer 24' (FIG. 7) can be produced by masking the upper surface of the semi-conductor wafer and diffusing in appropriate conductivity determining doping materials. the same also applies for the embodiments shown in FIGS. 8 and 9; in these embodiments the semiconductor laser wafer is applied to the metal support 23 after diffusion of the oppositely doped regions.

Figure 10:
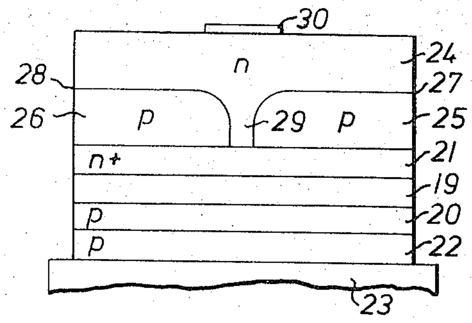
Figure 11:
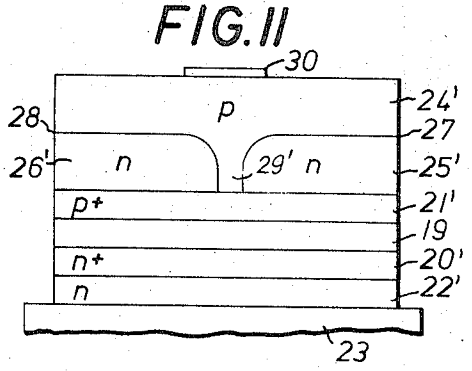

FIGS. 10 and 11 illustrate respectively semiconductor lasers which are modified versions of the embodiments shown respectively in FIGS. 6 and 7, the essential difference being the geometric reversal of the layer 24 (24') with respect to the layers 25, 26 (25', 26'), the electrode 30 being in contact with the layers 24 (24'). In the embodiments shown in FIGS. 10 and 11, the layers 21, 19, 20 and 22 (21', 19', 20' and 22') are preferably grown, or otherwise conventionally produced, subsequent to the formation of the layers 25 and 26 (25', 26') in the layer 24 (24'). The layer 24 (24') includes a narrow neck-like portion 29 (29') which extends to the layer 21 (21').

Figure 12:
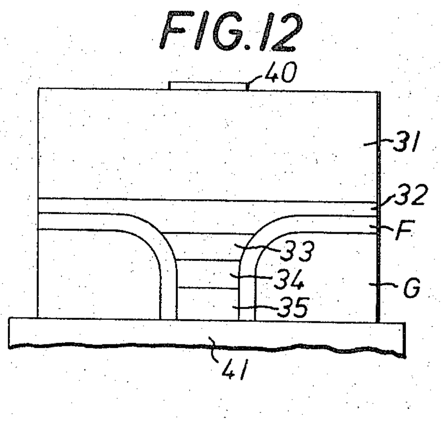
FIG. 12 is a front diagrammatic view of a further preferred embodiment of a semiconductor laser in the form of a heterostructure diode having an insulating region according to the present invention.

The construction of narrow current channels using barrier layers, as described above in conjunction with FIGS. 2–11, can also be effected by insulating regions as can be seen, for example, in FIG. 12. The heterostructure diode shown in FIG. 12 may consist initially of a substrate 31, for example of GaAs, on which layers 32, 33, 34 and 35 are grown. The layer 33 is to be the active zone of the semiconductor laser, while the layer 32 and the layer 34 are layers having greater band distances. Jumps in the band distances can be produced by mixed crystal layers, for example Ga Al As of different composition. The layer 35 is merely a covering layer which is necessary if the layer 34 is not corrosion resistant. To produce regions or layers F and G, of which at least the layer F must be insulating, a mask is applied to the lower surface of the semiconductive wafer, which mask corresponds to the lateral outline of the current-conducting region. The not covered surface portions of the semiconductive wafer are removed to form grooves by a conventional etching process where the depth of the thus produced grooves must extend into the layer 32. The grooves may even extend into the substrate 31. Then the grooves are filled with a protective insulating layer F which is preferably of high resistivity and/or with a further layer G which also is preferably of insulating material. The insulating substances used for the layers F and G may be materials which have a lower refractive index than the active zone formed by the layer 33, for example, so that lateral conductance of the light waves of the laser beam becomes possible due to total reflection in active layer 33. The layer F may be the same material as the active layer 33, but must, in such case, be undoped if again a jump of the refractive index is to be produced between the insulating layer F and the active zone formed by the layer 33. A conventional electrode 40 is applied to the surface of the substrate 31 and a massive heat conducting metal support 41, which serves as an electrode, is positioned on the layer 35 and the layers F and G. For the above mentioned etching process a mixture of three parts $H_2 SO_4$ with one part $H_2 O_2$ and one part $H_2 O$ is used. The etching time depends on the desired depth of the grooves. At a temperature of 50°C an etching rate of about $8 \times 10^{-6}$m per minute is achieved. To stop the etching process the etching mixture has to be removed and the etched surface has to be cleaned with water.

Combinations of the two above-described possibilities for forming a narrow current carrying path are possible, as is shown in the embodiments of heterostructural diode lasers illustrated respectively in FIGS. 13, 14, 15 and 16.

Figure 13:
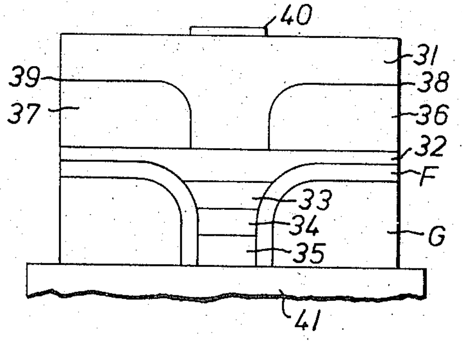
FIGS. 13–16 are respective front diagrammatic views, similar to that of FIG. 12, of additional preferred embodiments of respective semiconductor lasers in the form of heterostructure diodes according to the present invention.

In FIG. 13 the current channel is limited not only by the insulating layer F as in FIG. 12, but also by the layers 36 and 37 which are formed by diffusing doping material into the substrate 31 before the growing of the layers 32, 33, 34 and 35 so as to provide pn-junctions 38 and 39. If the layer 32 bordering the substrate 31 is n-conductive, the layers 36 and 37 are made p-conductive; when the layer 32 is p-conductive, the layers 36 and 37 are made to be n-conductive so that during operation the interfaces between each of the layers 36, 37 and the layer 32 are always blocked pn-junctions. A conventional electrode 40 is provided on the surface of the substrate 31 and a massive heat conductive metal electrode 31 is provided opposite the layer 35 and the layers F and G.

Figure 14:
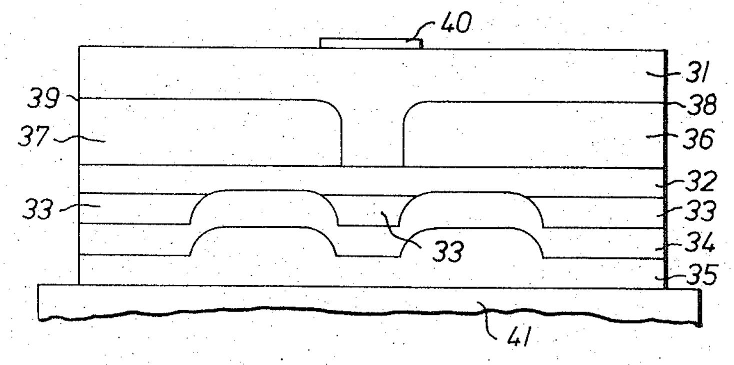
Figure 15:
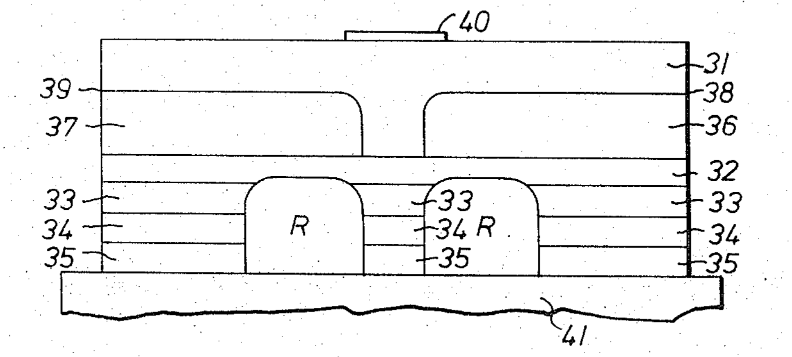
Figure 16:
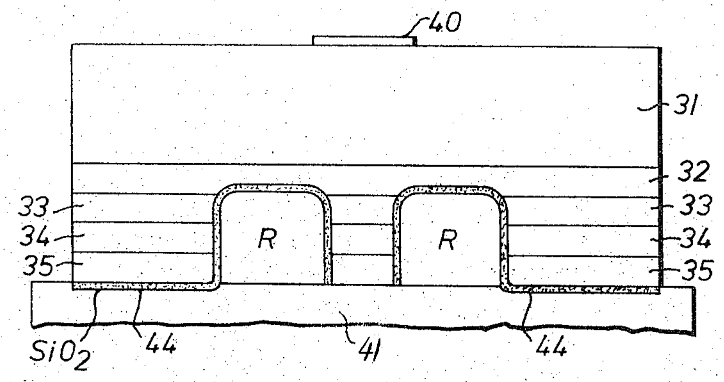

The modified embodiment shown in FIG. 14 is produced by etching a layer 33, which is to form the active region and subsequently growing layers 34 and 35. The lateral current limitation is effected as in the embodiment of FIG. 13. In FIG. 15 a further modification of the present invention is shown which corresponds somewhat to that of FIG. 14, the essential difference being that the etched grooves, indicated by R are not filled with material; rather the grooves R are left open. In order to produce mechanical stability, supporting structure is left unetched and in place toward the outside of the semiconductor wafer. The current flow through these supports is suppressed by the diffused layers 36 and 37 as shown, for example, in FIG. 13. The transverse resistance of layer 32 is high due to the narrow layer thickness. The grooves R must be etched at least to the layer 32, but may extend into the substrate 31. FIG. 16 illustrates an embodiment similar to that of FIG. 15 and also is provided with unfilled grooves R. In this embodiment, current flow is prevented through the lateral supports by an insulating layer 44 formed by vapor-deposition or other deposition of $SiO_2$. This simultaneously prevents short circuits which may be produced by the solder rising into the etched grooves R. When diffused structures are used for the lateral current limitation the etching must be effected exactly into the layer 32 since the barrier layers between layers 36, 37 and the layer 32 are required.

Insulating or differently doped regions can be produced in laser diodes in which the electrodes completely cover the outer surfaces of the two respective outer layers or in which the electrodes already have a special shape, for example, the shape of a strip. With the latter embodiment of a diode, the regions are preferably produced in the layer in such a manner that the remaining current paths lie below the strip-shaped electrode so that the current density will be further increased in this area.

With the above-described arrangements current paths can be produced whose lateral dimensions lie in the order of magnitude of a micron, i.e., in the same order of magnitude as, for example, the core diameter of a light-conductive fiber. It is also possible in this way to excite a transverse mode in a semiconductor laser which mode is particularly suited for coupling into a light-conductive fiber.

It will be understood that the above description of the present invention is susceptible to various modifications, changes and adaptations, and the same are intended to be comprehended within the meaning and range of equivalents of the appended claims.

We claim:

1. In a double heterostructure laser diode including a semiconductor body having a light emitting active layer, a highly doped first layer of a first conductivity type overlying one major surface of said active layer, a second layer of said first conductivity type overlying said first layer, a third highly doped layer of the opposite conductivity type overlying the opposite major surface of said active layer and a fourth layer of said opposite conductivity type overlying said third layer, said first and third layers being formed of a crystal whose band spacing between the valance band and the conductive band is greater than that of the crystal which forms said active layer, the improvement comprising: first means extending into said semiconductor body from one major surface thereof through said second layer and at least into said first layer for confining the current flow through said first and second layers to a narrow path and for blocking current flow through laterally extending portions of said first and second layers; and further means for limiting the current flow in said fourth layer to a narrow path which is aligned with the said narrow path through said first and second layers, said further means comprise spaced apart semiconductor regions of said first conductivity type within said fourth layer at the interface of said third and fourth layers and forming respective barrier layers with said fourth layer, said narrow path in said fourth layer being between said barrier layers.

2. A semiconductor laser as defined in claim 1 wherein said first means for confining the current to a narrow path comprises insulating means, said narrow path being defined by a portion of each of said first and second layers extending between said insulating means.

3. A semiconductor laser as defined in claim 1 wherein said first means for confining the current comprise spaced apart insulating regions, said narrow current path being between said insulating regions.

4. A semiconductor laser as defined in claim 1 wherein the surface area of said portion of said semiconductor body defined by said narrow current path is substantially strip-shaped in a plane substantially perpendicular to the current path.

5. A semiconductor laser as defined in claim 4 wherein said light-emitting active layer comprises a layer of substantially homogeneous material whereby light is emitted at least from an area of said layer of substantially homogeneous material.

6. A semiconductor laser as defined in claim 1 wherein said means for confining the current comprise spaced apart insulating regions, said insulating regions having a lower refractive index than said light emitting active layer.

7. A semiconductor laser as defined in claim 1 wherein said light-emitting active layer is operatively arranged to be excited in at least one transverse mode.

8. A semiconductor laser as defined in claim 1 wherein said light-emitting active layer comprises an active zone of compensatedly doped semiconductor material.

9. A semiconductor laser as defined in claim 1 wherein said light-emitting active layer comprises an active zone formed of a mixed crystal and at least one of said first and third layers is formed of a mixed crystal.

10. A semiconductor laser as defined in claim 1 wherein at least one of said active zone and said second and fourth layers is formed of GaAs.

11. A semiconductor laser as defined in claim 9 wherein at least one of said active zone and said first and third layers is formed of GaAlAs.

12. A semiconductor laser as defined in claim 1 wherein said means for confining the current extends through said first layer and said active layer and into said third layer to additionally confine the current in said active and said third layers to said narrow path.

13. A semiconductor laser as defined in claim 12 wherein said means for confining the current comprise spaced apart insulating regions, said narrow current path being between said insulating regions.

14. A semiconductor laser as defined in claim 12 wherein said means for confining the current comprise spaced apart recesses, said narrow current path being between said recesses.

15. A semiconductor laser as defined in claim 14 further comprising a layer of insulating material covering the surface of each of said recesses and the associated major surface of said semiconductor body outside of the portion thereof constituting said narrow current path.

16. In a double heterostructure laser diode including a semiconductor body having a light emitting active layer, a highly doped first layer of a first conductivity type overlying one major surface of said active layer, a second layer of said first conductivity type overlying said first layer, a third highly doped layer of the opposite conductivity type overlying the opposite major surface of said active layer and a fourth layer of said opposite conductivity type overlying said third layer, said first and third layers being formed of a material whose band spacing between the valance band and the conductive band is greater than that of the material which forms said active layer, the improvement comprising means for confining the current flow through said active layer to a narrow path and for blocking current flow through laterally extending portions of said active layer, said means including spaced portions of said first layer extending through said active layer and into said third layer and isolating a narrow portion of said active layer between said spaced portions, and narrowly spaced apart semiconductor regions of said first conductivity type within said fourth layer at the interface of said third and fourth layers and forming respective barrier layers with said fourth layer, the portion of said fourth layer between said spaced regions at said interface being substantially aligned with said isolated portion of said actve layer.

* * * * *